(12) United States Patent
Daminger et al.

(10) Patent No.: US 11,895,797 B2
(45) Date of Patent: Feb. 6, 2024

(54) ELECTRICAL DEVICE INCLUDING A CONNECTION PART AND A COVER PART CONNECTED TO THE CONNECTION PART

(71) Applicant: SEW-EURODRIVE GMBH & CO. KG, Bruchsal (DE)

(72) Inventors: Franz Daminger, Ludwigshafen am Rhein (DE); Ralph Mayer, Ubstadt-Weiher (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 389 days.

(21) Appl. No.: 17/272,471

(22) PCT Filed: Aug. 9, 2019

(86) PCT No.: PCT/EP2019/025265
§ 371 (c)(1),
(2) Date: Mar. 1, 2021

(87) PCT Pub. No.: WO2020/043324
PCT Pub. Date: Mar. 5, 2020

(65) Prior Publication Data
US 2021/0329806 A1    Oct. 21, 2021

(30) Foreign Application Priority Data

Aug. 27, 2018    (DE) .......................... 102018006722.0

(51) Int. Cl.
*H05K 7/14*      (2006.01)
(52) U.S. Cl.
CPC ......... *H05K 7/1432* (2013.01); *H05K 7/1454* (2013.01); *H05K 7/1455* (2013.01)
(58) Field of Classification Search
None
See application file for complete search history.

(56) References Cited

U.S. PATENT DOCUMENTS 3,675,083 A * 7/1972 White ...................... H05K 1/14
439/55
3,808,532 A * 4/1974 Yuska .................. H01R 12/721
439/945

(Continued)

FOREIGN PATENT DOCUMENTS

| CN | 102025906 A | 4/2011 |
| CN | 106208622 A | 12/2016 |

(Continued)

OTHER PUBLICATIONS

International Search Report issued in corresponding International Application No. PCT/EP2019/025265, dated Jan. 3, 2020, pp. 1-2, English Translation.

*Primary Examiner* — Krystal Robinson
(74) *Attorney, Agent, or Firm* — CARTER, DELUCA & FARRELL LLP

(57) ABSTRACT

An electrical device includes a connection part and a cover part connected to the connection part. A mounting part is accommodated and situated in the connection part, and a first circuit board is connected to the mounting part in a coded manner. A second circuit board is situated in the cover part, which is connected to a frame part in a coded manner. The first circuit board is connected to a plug connector part, and the second circuit board is connected to a mating plug connector part. A leading guide for a plug connection is provided on the mounting part, which becomes active when the cover part is connected to the connection part. The frame part being able to be connected to the mounting part in a coded manner.

21 Claims, 6 Drawing Sheets

(56) References Cited

U.S. PATENT DOCUMENTS

| | | | | |
|---|---|---|---|---|
| 4,579,412 | A | * | 4/1986 | Czeschka ........... H01R 12/7005 439/680 |
| 4,595,250 | A | * | 6/1986 | Joly .................... H01R 13/645 439/680 |
| 4,647,123 | A | * | 3/1987 | Chin ..................... G06F 13/409 711/E12.088 |
| 5,388,995 | A | * | 2/1995 | Rudy, Jr. ............ H01R 13/6596 361/730 |
| 5,629,831 | A | * | 5/1997 | Eggert ................. H05K 7/1472 361/728 |
| 5,706,179 | A | * | 1/1998 | Palatov ................ H05K 7/1429 439/59 |
| 5,943,219 | A | * | 8/1999 | Bellino ................ H05K 9/0015 174/383 |
| 6,229,232 | B1 | | 5/2001 | Roth-Stielow et al. |
| 6,356,454 | B1 | | 3/2002 | Braunlich |
| 2004/0033720 | A1 | * | 2/2004 | Bergner ............... H01R 9/2675 439/532 |
| 2015/0124409 | A1 | | 5/2015 | Kawano et al. |
| 2015/0381016 | A1 | | 12/2015 | Tsuda et al. |
| 2016/0352215 | A1 | | 12/2016 | Momose |
| 2019/0051875 | A1 | * | 2/2019 | Choi ................... H01M 50/271 |

FOREIGN PATENT DOCUMENTS

| | | |
|---|---|---|
| DE | 19704226 A1 | 8/1998 |
| EP | 0089211 A1 | 9/1983 |
| JP | 2012129246 A | 7/2012 |
| WO | 9914995 A1 | 3/1999 |

\* cited by examiner

ELECTRICAL DEVICE INCLUDING A CONNECTION PART AND A COVER PART CONNECTED TO THE CONNECTION PART

FIELD OF THE INVENTION

The present invention relates to an electrical device having a connection part and a cover part connected to the connection part.

BACKGROUND INFORMATION

Certain conventional electric motors are able to be operated in an rpm-controlled manner by an electrical device functioning as an inverter.

SUMMARY

Example embodiments of the present invention provide an electrical device.

According to an example embodiment of the present invention, an electrical device includes a connection part and a cover part, which is connected to the connection part, e.g., a cover part that is placed on top of and connected to the connection part. A mounting part is accommodated and situated in the connection part, and a first circuit board is connected to the mounting part in a coded manner. A second circuit board is situated in the cover part, which is connected to, e.g., fitted with, a frame part in a coded manner. The first circuit board is connected to, e.g., with, a plug connector part, and the second circuit board is connected to, e.g., fitted with, a mating plug connector part. A leading guide for a plug connection is provided on the mounting part, which becomes active when the cover part is connected to the connection part, in particular which guides the cover part when it is placed on the connection part, before the plug connector part establishes contact with the mating plug connector part. The frame part is able to be connected, e.g., is connected, to the mounting part in a coded manner.

This offers the advantage that the coding makes it possible to avoid faulty wiring or a faulty allocation. In addition, the placement of the cover part on the connection part is carried out in a guided manner. The plug connection as well as the coding are therefore able to be activated without tilting.

According to example embodiments, the coded connections are formed by coding lugs, which are in an operative connection with recesses such as slots or holes. This offers the advantage that the coding is able to be achieved in an uncomplicated manner.

According to example embodiments, the mounting part has coding lugs which project from a first side of the mounting part, and it has coding lugs which project from the side situated opposite the first side, the coding lugs, for example, projecting transversely to the plug connection direction of the particular plug connection on the mounting part that has the plug connector part and the mating plug connector part. This offers the advantage that a connection is able to be coded on both sides. In addition, the plug connector part is therefore alignable so that it projects from the circuit board in the plug-in connection. The coding between the mounting part and the circuit board is therefore active transversely to the plug connection direction when the circuit board is connected to the mounting part. In contrast, the other coding situated opposite on the mounting part is active parallel to the plug connection direction.

According to example embodiments, the leading guide is arranged in the form of a guide lug which projects from the mounting part. This is considered advantageous insofar as tilting is readily preventable.

According to example embodiments, coding lugs are formed on the mounting part for the coded connection of the mounting part to the first circuit board, the coding lugs projecting into or through recesses of the first circuit board. This has the advantage that the coding is able to be obtained in an economical manner.

According to example embodiments, coding lugs, which project into or through recesses of the second circuit board, are formed on the frame part for the coded connection of the frame part to the second circuit board. This offers the advantage that the coding is able to be obtained in an economical manner.

According to example embodiments, coding lugs, which project into slots of the frame part, are formed on the mounting part for the coded connection of the frame part to the mounting part. This offers the advantage that the coding is able to be obtained in an economical manner.

According to example embodiments, the frame part and the mounting part are produced as plastic injection molded parts in each case. This is considered advantageous insofar as it allows for a simple and cost-effective production and makes it possible to obtain the coding without any particular effort.

According to example embodiments, the electrical device is arranged as a converter and/or has an inverter, which feeds an electric motor on which the connection part is fixed in place. This is considered advantageous insofar as a compact converter motor is able to be produced.

According to example embodiments, an electronic circuit, which is situated in the cover part on the second circuit board, functions as an electronics of a converter or an inverter, which, for example, is supplied by three-phase power lines routed into the connection part and whose electrical connection feeding an electric motor is electrically connected to the connection of the electric motor via contacts of the plug connector part and lines routed out of the connection part and to the electric motor. This has the advantage that the electric motor is able to be operated in an rpm-controlled manner.

Further features and aspects of example embodiments of the present invention are described in greater detail below with reference to the appended schematic Figures.

DETAILED DESCRIPTION

Figure 1:
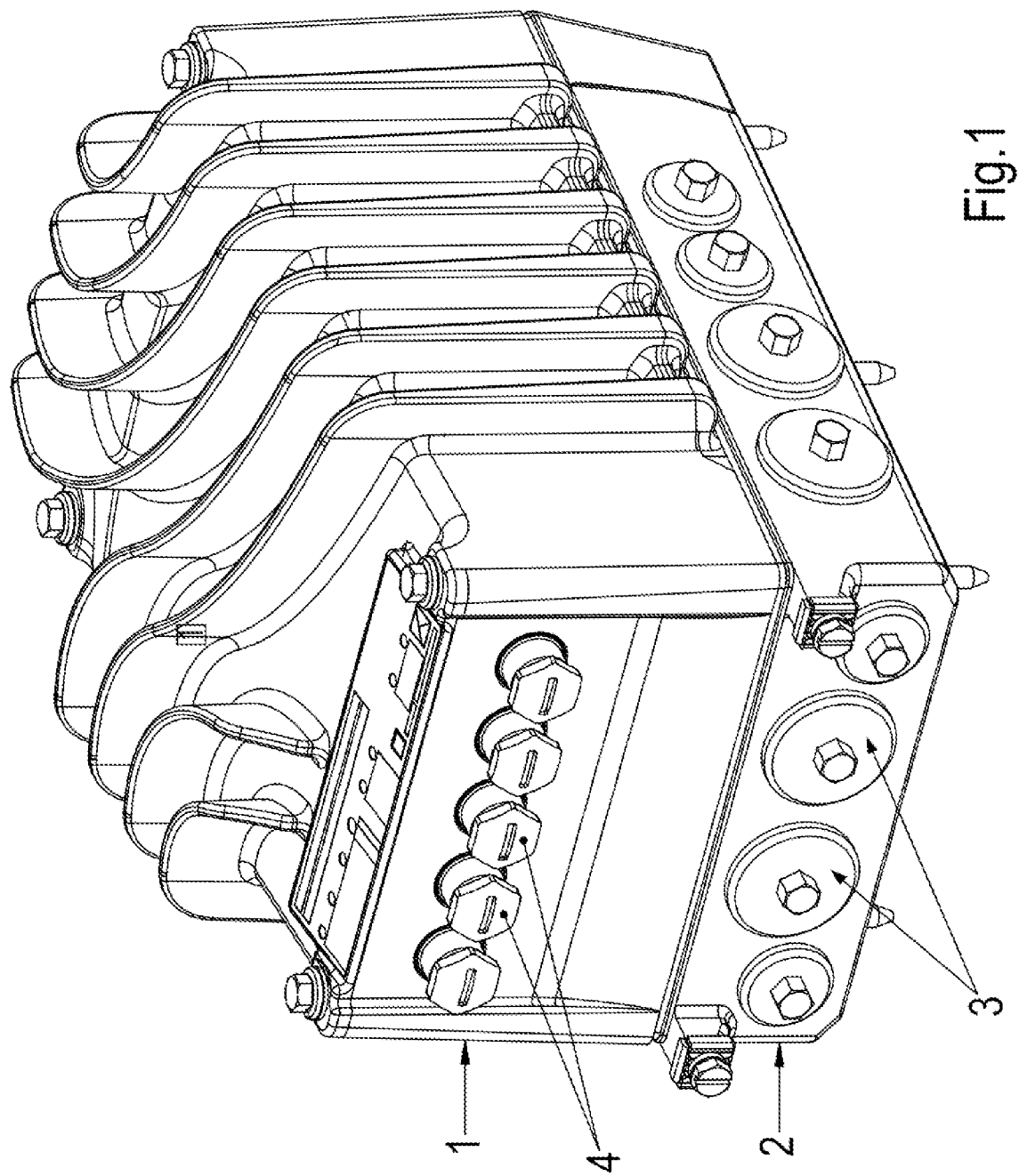
FIG. 1 is a perspective view of an electrical device, which includes a cover part 1 placed on a connection part 2.
Figure 2:
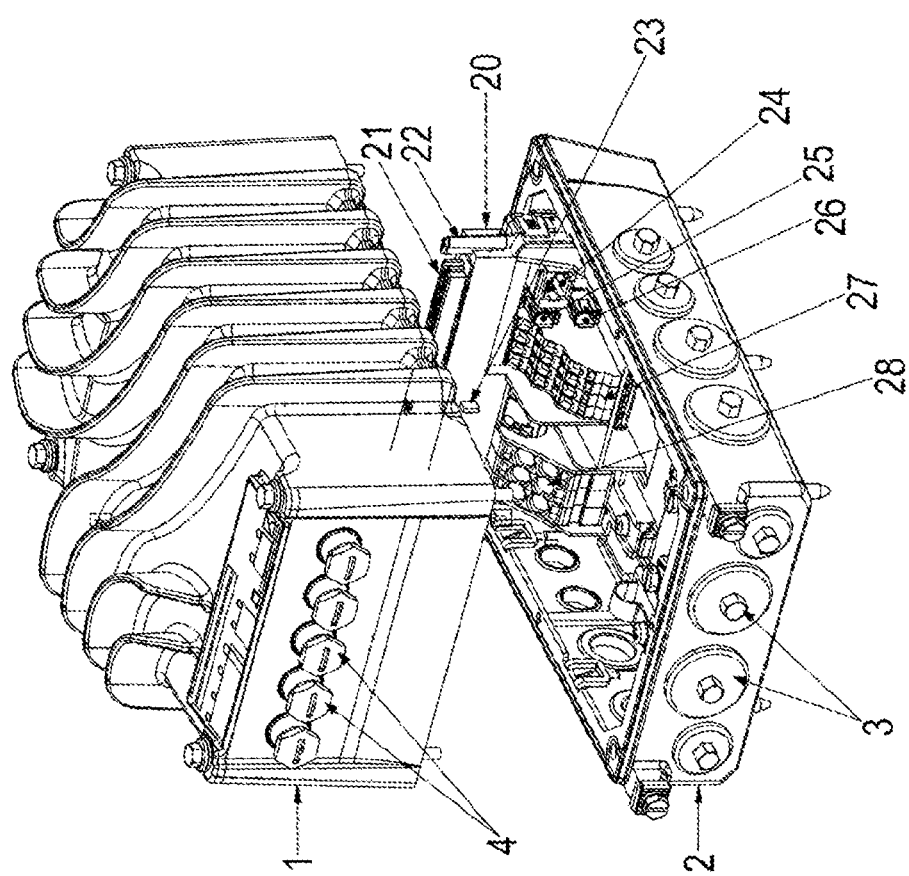
FIG. 2 illustrates the electrical device in an exploded and exploded view, in which a mounting part 20 disposed in connection part 2 is illustrated.
Figure 3:
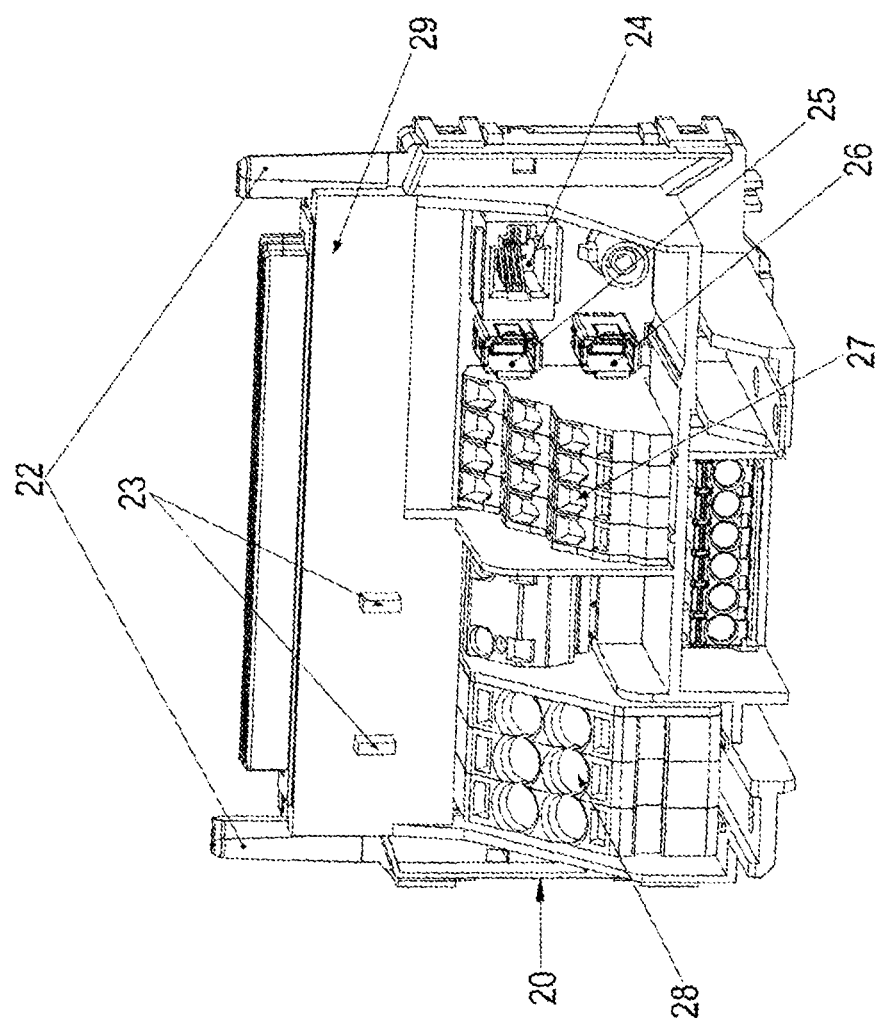
FIG. 3 is a perspective view of mounting part 20 together with a plug connector part 21 mounted on a circuit board 50, and sockets 24 to 26 as well as connection elements 27, 28.
Figure 4:
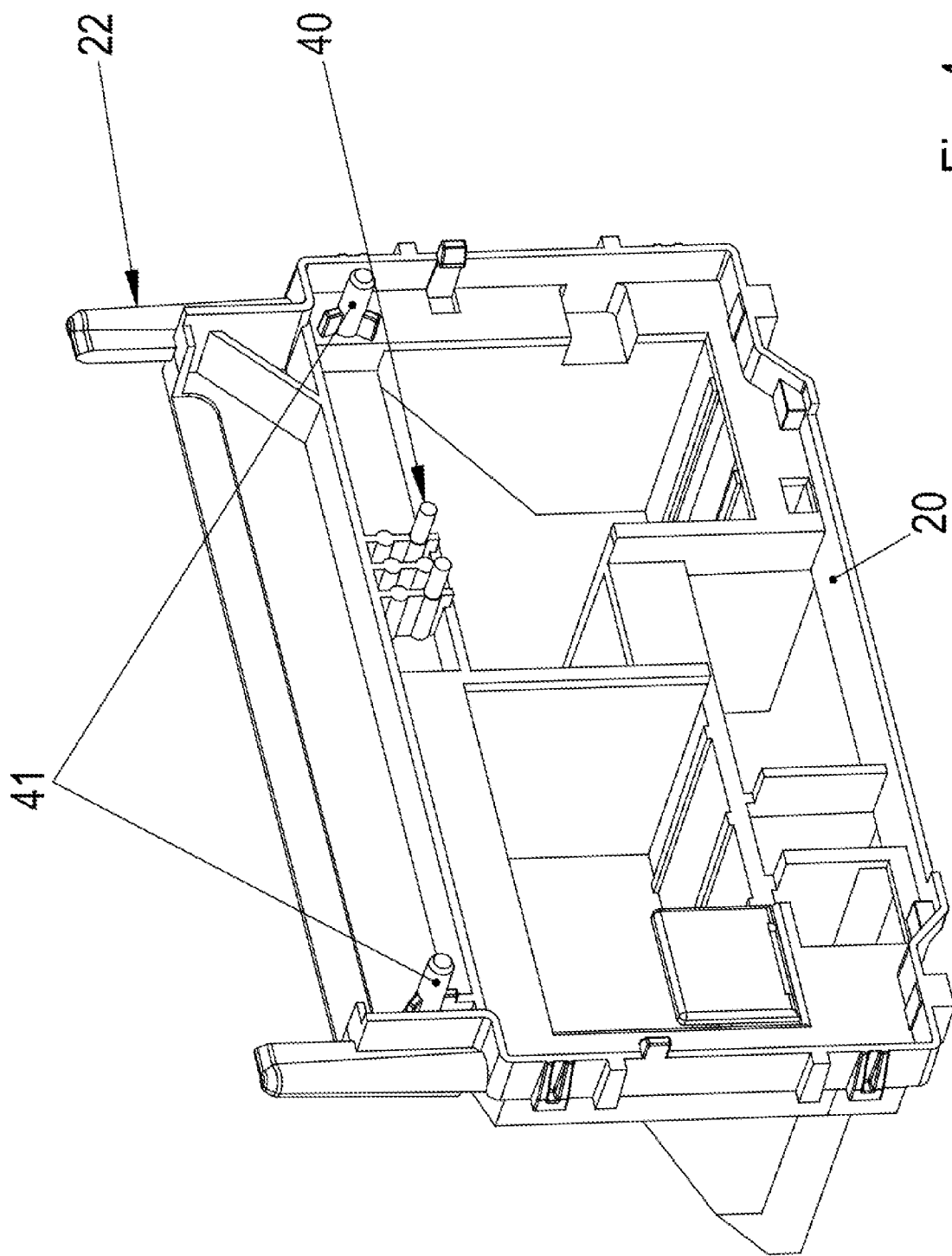
FIG. 4 is a perspective view of mounting part 20 by itself.
Figure 5:
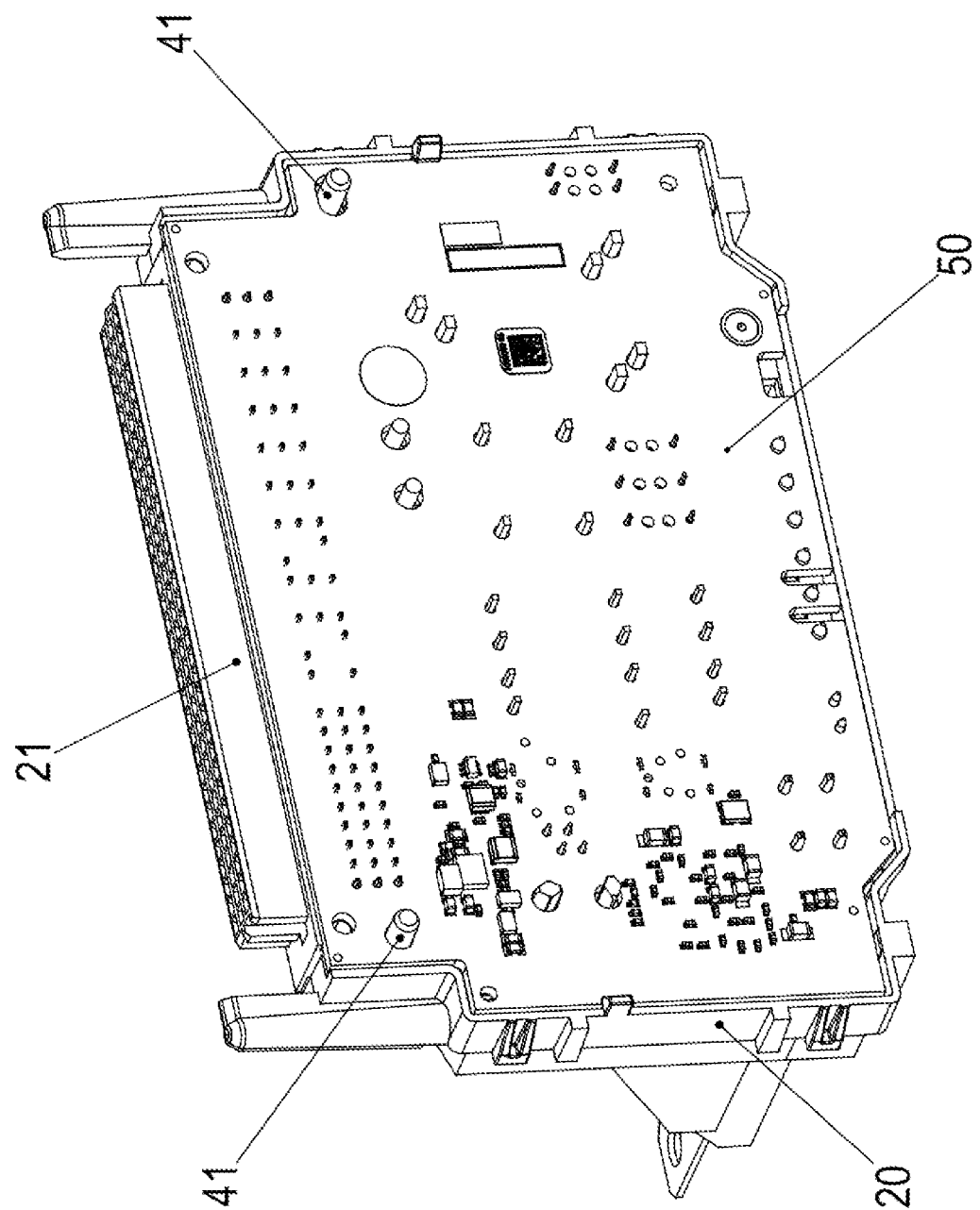
FIG. 5 illustrates mounting part 20 together with circuit board 50 from a viewing direction that differs from that of FIG. 3.
Figure 6:
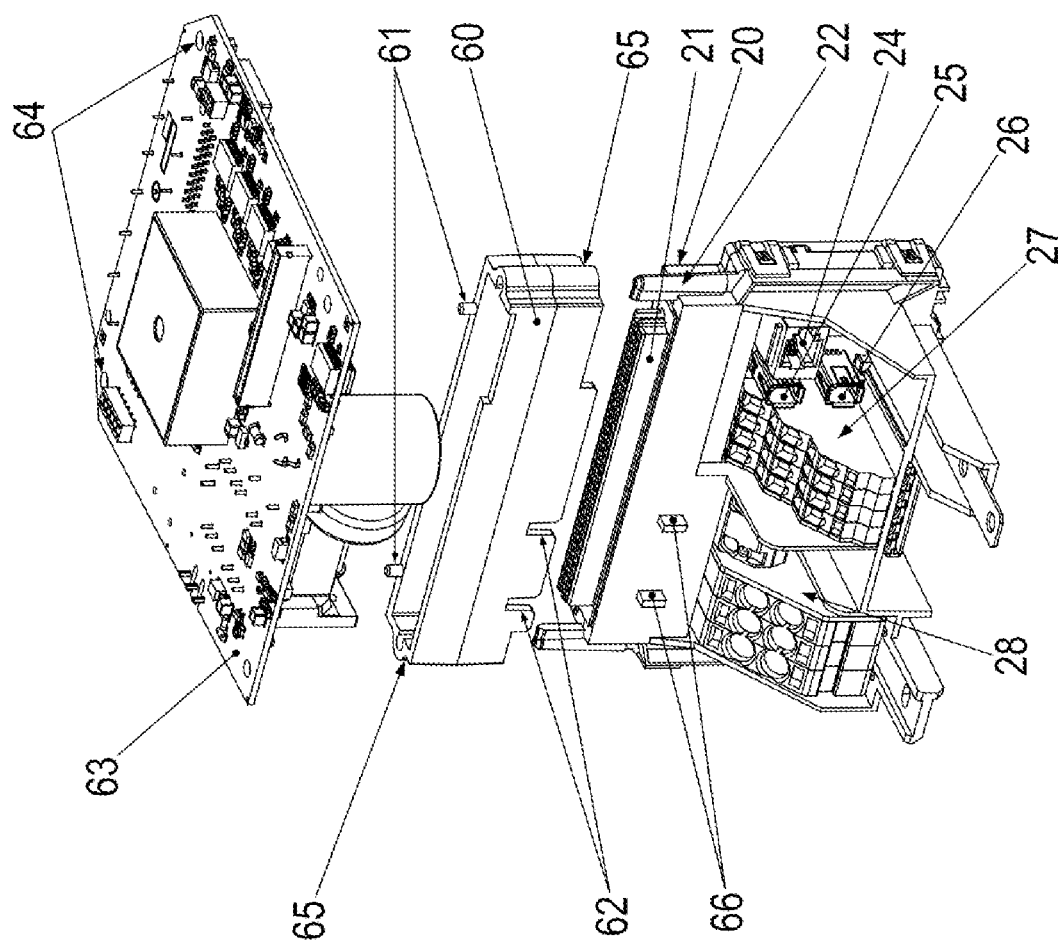
FIG. 6 is an exploded view of mounting part 20 and a circuit board 63 on which a mating connector part corresponding to plug connector part 21, as well as a frame part 63, e.g., a coding frame, is situated.

As schematically illustrated in the Figures, the electrical device according to an example embodiment of the present invention has a cover part 1 inside which circuit board 63 is situated, and a connection part 2 in which a mounting part 20 is situated.

Mounting part 20 is connected to connection part 2 by a nonpositive and/or positive connection. Connection part 2, for example, surrounds mounting part 20 in the manner of a housing.

Circuit board 63 is, for example, fixed in place in cover part 1 with the aid of screws. For example, the screws are at least partially screwed into cover part 1.

Circuit board 50 is fitted with a plug connector part 21, which is able to be plugged into a corresponding mating plug connector part situated on circuit board 63 when cover part 1 is placed on top of connection part 2.

In addition, circuit board 50 is fitted with sockets 24 to 26 and connection elements 27, 28 so that supply lines are able to be connected to connection elements 28 within connection part 2 whose contacts are connected to contacts of plug connector part 21 and thus allow for the supply of the electronic circuit in cover part 1.

The electronic circuit including circuit board 63 is, for example, arranged as a converter which feeds an electric motor. The electric motor is thus able to be controlled or regulated based on the speed with the aid of the three-phase-supplied converter. The connection lines of the electric motor are routed into connection part 2 through a cable gland and connected there to connection elements 28 so that the electric motor is able to be supplied from the electronic circuit via contacts of plug connector part 21.

The three-phase power lines are connected to connection elements 28, which supply the electronic circuit via contacts of plug connector part 21.

Circuit board 63 together with plug connector part 21 mounted thereon and sockets 24 to 26 for the communications lines and together with the connection elements 27, 28 is screwed to mounting part 20.

Guide lugs 22, which function as leading guides, are formed on mounting part 20. When cover part 1 is placed on connection part 2, tilting can therefore be avoided and the plug connection between plug connector part 21 and the mating plug connector part allows for a guided connection, guide lugs 22, which are formed on mounting part 20 so as to project toward the cover part, first activating the guide and a plug connection then being induced in a next step.

Placed on top of mounting part 20 together with plug connector part 21 is a frame part 60, which surrounds plug connector part 21. Coding lugs 61, which project into recesses 64 of circuit board 63, are formed on frame part 60. Coding is therefore able to be provided.

On the side of frame part 60 facing mounting part 20, coding slots 62 are provided in frame part 60 with the aid of which frame part 60 is placed on coding lugs 66.

In the same manner as the mutual clearances between recesses 64, coding is also possible by the mutual clearance between coding lugs 66 as well as slots 62.

Because the electrical device is made from a modular system which has at least two different circuit boards 63 and at least two different mounting units 20, coding as described herein only allows for the connection of the uniquely allocated units or circuit boards 63.

When components are assembled on circuit board 63, frame part 60 is additionally positioned on circuit board 63. In the process, frame part 60 is placed on circuit board 63 such that coding lugs 61 project into recesses 64 of circuit board 63. As a result, only frame part 60 allocated to circuit board 63, i.e., a correctly coded frame part 60, is able to be mounted. Similar frame parts 60 having a different clearance between coding lugs 61 do not fit and can therefore not be mounted.

In this manner, frame part 60 is uniquely allocated to circuit board 63.

When cover part 1 is placed on top of connection part 2, frame part 60, e.g., its guide grooves 65, first makes contact with guide lugs 22, i.e., in particular with the leading guide. This allows for a guided connection and prevents tilting.

However, mounting part 20 also has coding lugs 40 and 41 of its own, which project into or through recesses of circuit board 50.

As a result, the coding lugs 40, 41 of mounting part 20 ensure the correct allocation of circuit board 50 to mounting part 20. Accordingly, the coding therefore improves the reliable allocation and consequently prevents errors when the elements of the modular system to be combined are assembled, e.g., the mounting parts and circuit boards to be combined.

Coding lugs 40 and 41 laterally project from a first side of mounting part 20. Coding lugs 66, on the other hand, project at the opposite side of mounting part 20.

Overall, the connection between circuit board 50 and mounting part 20 is coded as is the connection between mounting part 20 and frame part 60. In addition, the connection between circuit board 63 and frame part 60 is coded as well.

In other words, circuit board 50 is connected to mounting part 20 in a coded manner and mounting part 20 is connected to frame part 60. In addition, circuit board 63 is connected to frame part 60 in a coded manner.

The routing of the supply lines and data lines from the outside through cable glands 3 is able to be obtained with the aid of hybrid cables or by a separate three-phase power cable and data cable. Alternatively, only a three-phase power cable may be introduced into the connection part through cable gland 3 and the data lines are able to be routed via socket 4 provided on cover part 1 when the corresponding sealing cover of socket 4 is removed.

In further exemplary embodiments, the coding device(s), such as coding lugs and slots or recesses, are switched. As an alternative, clip-in connections may be used as well. Nevertheless, when a first unit is connected to a second unit, a coding device is always situated on the first unit and a corresponding coding device is situated on the second unit. The connection is thus a coded connection.

LIST OF REFERENCE NUMERALS 1 cover part
1 connection part
3 cable gland for a supply cable and/or hybrid cable
4 socket part with sealing cap
20 mounting part
21 plug connector part
22 guide lug, e.g., leading guide
23 coding lug
24 socket for a data transmission
25 socket for a data transmission
26 socket for a data transmission
27 connection element for signal lines
28 connection element for supply lines, e.g., three-phase lines
40 coding lug
41 coding lug
50 circuit board
60 frame part, e.g., coding frame 61 coding lug
62 coding slot
63 circuit board
64 recess
65 guide groove
66 coding lugs

The invention claimed is:

1. An electrical device, comprising:
a connection part;
a cover part connected to the connection part;
a mounting part accommodated and arranged in the connection part;
a first circuit board connected to the mounting part in a coded manner and connected to a plug connector part; and
a second circuit board arranged in the cover part and connected to a frame part in a coded manner, the second circuit board connected to a mating plug connector part;
wherein the mounting part includes a leading guide for a plug connection, the leading guide adapted to become active when the cover part is connected to the connection part; and
wherein the frame part is adapted to be connected to the mounting part in a coded manner.

2. The electrical device according to claim 1, wherein the cover part is arranged on top of and is connected to the connection part.

3. The electrical device according to claim 1, wherein the second circuit board is fitted with the frame part in the coded manner.

4. The electrical device according to claim 1, wherein the first circuit board is fitted with the plug connector part.

5. The electrical device according to claim 1, wherein the second circuit board is fitted with the mating plug connector part.

6. The electrical device according to claim 1, wherein the leading guide is adapted to guide the cover part when it the cover part is placed on the connection part before the plug connector part establishes contact with the mating plug connector part.

7. The electrical device according to claim 1, wherein the frame part is connected to the mounting part in the coded manner.

8. The electrical device according to claim 1, wherein the coded connections include coding lugs in operative connection with recesses.

9. The electrical device according to claim 8, wherein the recesses include slots and/or holes.

10. The electrical device according to claim 1, wherein the mounting part include coding lugs that project on a first side of the mounting part and coding lugs that project on a second side arranged opposite the first side.

11. The electrical device according to claim 10, wherein the coding lugs project transversely to a plug connection direction of the particular plug connection on the mounting part that has the plug connector part and the mating plug connector part.

12. The electrical device according to claim 1, wherein the leading guide includes as a guide lug projecting on the mounting part.

13. The electrical device according to claim 1, wherein coding lugs are provided on the mounting part for the coded connection of the mounting part to the first circuit board, the coding lugs projecting into and/or through recesses of the first circuit board.

14. The electrical device according to claim 1, wherein coding lugs are provided on the frame part for the coded connection of the frame part to the second circuit board, the coding lugs projecting into and/or through recesses of the second circuit board.

15. The electrical device according to claim 1, wherein coding lugs are provided on the mounting part for the coded connection of the frame part to the mounting part, the coding lugs projecting into slots of the frame part.

16. The electrical device according to claim 1, wherein the frame part and the mounting part are arranged as plastic injection molded parts.

17. The electrical device according to claim 1, wherein the frame part and the mounting part include plastic injection molded parts.

18. The electrical device according to claim 1, wherein the electrical device is arranged as a converter and/or includes an inverter that feeds an electric motor on which the connection part is fixed in place.

19. The electrical device according to claim 1, wherein an electronic circuit provided in the cover part on the second circuit board is arranged as a converter and/or as an electronic circuit of a converter and/or an inverter.

20. The electrical device according to claim 19, wherein the electronic circuit is adapted to be supplied with the aid of three-phase power lines routed into the connection part and includes an electrical connection adapted to feed an electric motor being electrically connected to a connection of the electric motor via contacts of the plug connector part and lines routed out of the connection part and to the electric motor.

21. The electrical device according to claim 1, wherein the first circuit board includes the plug connector part, the second circuit board includes the mating plug connector part, and the plug connector part and the mating plug connector part are connected to each other in a mating plug connection.

* * * * *